(12) United States Patent
Takagi et al.

(10) Patent No.: US 9,583,528 B2
(45) Date of Patent: *Feb. 28, 2017

(54) SOLID-STATE IMAGING DEVICE

(71) Applicant: SONY CORPORATION, Tokyo (JP)

(72) Inventors: Noriko Takagi, Tokyo (JP); Hiroyuki Mori, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 123 days.

This patent is subject to a terminal disclaimer.

(21) Appl. No.: 14/923,683

(22) Filed: Oct. 27, 2015

(65) Prior Publication Data

US 2016/0049437 A1    Feb. 18, 2016

Related U.S. Application Data

(60) Continuation of application No. 14/546,803, filed on Nov. 18, 2014, now Pat. No. 9,196,649, which is a continuation of application No. 13/954,348, filed on Jul. 30, 2013, now Pat. No. 8,895,382, which is a division of application No. 11/366,296, filed on Mar. 2, 2006, now Pat. No. 8,507,961.

(30) Foreign Application Priority Data

Mar. 9, 2005   (JP) ................................. 2005-065987

(51) Int. Cl.
*H01L 29/792* (2006.01)
*H01L 27/146* (2006.01)
*H01L 31/02* (2006.01)

(52) U.S. Cl.
CPC .. *H01L 27/14643* (2013.01); *H01L 27/14603* (2013.01); *H01L 27/14609* (2013.01); *H01L 27/14612* (2013.01); *H01L 27/14689* (2013.01); *H01L 31/02* (2013.01); *Y10S 438/942* (2013.01)

(58) Field of Classification Search
CPC ............ H01L 27/146; H01L 27/14601; H01L 27/14603; H01L 27/14609; H01L 27/14612; H01L 27/14625; H01L 27/14643; H01L 27/14689; H01L 257/14812
USPC ........................ 257/290–293, 431, E27.133, 257/E31.083–E31.085
See application file for complete search history.

(56) References Cited

U.S. PATENT DOCUMENTS

| 7,352,047 B2 * | 4/2008 | Chen ................... B81C 1/00246 257/365 |
| 7,575,977 B2 * | 8/2009 | Levin ................ H01L 21/82380 257/E21.427 |
| 2005/0151175 A1 * | 7/2005 | Ohkawa ............ H01L 27/14601 257/292 |

* cited by examiner

*Primary Examiner* — Kyoung Lee
*Assistant Examiner* — Joannie A Garcia
(74) *Attorney, Agent, or Firm* — Chip Law Group

(57) ABSTRACT

A MOS solid-state imaging device is provided in which withstand voltage and 1/f noise of a MOS transistor are improved. In the MOS solid-state imaging device whose unit pixel has at least a photoelectric converting portion and a plurality of field effect transistors, the thickness of gate insulating film in a part of the field effect transistors is different from the thickness of gate insulating film in the other field effect transistors among the plurality of the field effect transistors.

14 Claims, 6 Drawing Sheets

SOLID-STATE IMAGING DEVICE

CROSS REFERENCES TO RELATED APPLICATIONS

The subject matter of application Ser. No. 14/546,803 is incorporated herein by reference. The present application is a Continuation of U.S. Ser. No. 14/546,803, filed Nov. 18, 2014, now U.S. Pat. No. 9,196,649, which is a Continuation of U.S. Ser. No. 13/954,348, filed Jul. 30, 2013, now U.S. Pat. No. 8,895,382, issued Nov. 25, 2014, which is a Divisional of U.S. Ser. No. 11/366,296, filed Mar. 2, 2006, now U.S. Pat. No. 8,507,961, issued Aug. 13, 2013, which claims priority to Japanese Patent Application JP 2005-065987 filed in the Japanese Patent Office on Mar. 9, 2005, the entire contents of which being incorporated herein by reference.

BACKGROUND OF THE INVENTION

Field of the Invention

The present invention relates to a solid-state imaging device, particularly to a MOS (or CMOS) type solid-state imaging device whose unit pixel has at least a photoelectric converting portion and a plurality of insulated-gate field effect transistors (hereinafter mainly called MOS transistors), and a method of manufacturing the solid-state imaging device.

Description of the Related Art

FIG. 1 shows a schematic constitutional diagram of an example of a MOS type solid-state imaging device. This solid-state imaging device has an imaging portion 20 in which a number of unit pixels 1 are disposed in horizontal and vertical directions, and peripheral circuits such as a vertical driver circuit 21 and a horizontal driver circuit 22.

As shown in FIG. 2, for example, the unit pixel 1 is configured to have a photodiode 2 that is a photoelectric converting portion functioning as a sensor, a readout MOS transistor 3 that reads out signal charge generated in the photodiode 2 in accordance with the amount of received light, an FD (Floating Diffusion) amplifier MOS transistor 4 that converts the signal charge into voltage or current corresponding to the amount thereof, an FD reset MOS transistor 5 and a vertical selection MOS transistor 6 (refer to Patent Reference 1).

However, various problems have occurred in the readout MOS transistor in a solid-state imaging device.

It is found that the above-described MOS transistors constituting the unit pixel are formed with gate insulating film made of oxide film having the same thickness, which has caused problems.

For example, regarding the readout MOS transistor 3 which reads out the signal charge from the photodiode 2 that is the photoelectric converting portion as described above, there is a problem of withstand voltage of the readout transistor, such that with a high electric field being applied between the gate and drain that is FD, the gate insulating film is destroyed.

Specifically, the withstand voltage becomes a problem, because when the transistor is OFF, gate potential is set to negative potential with respect to a well region in a transistor formed portion in order to suppress leak current caused by depletion of a lower layer in a gate region and to reduce noise (refer to Patent Reference 2), and potential of FD, namely, voltage of the drain of the readout MOS transistor needs to be set to high potential in order to increase signal charge amount, in other words, saturation signal amount accumulated in the sensor portion and to improve a dynamic range.

On the other hand, with respect to the amplifier MOS transistor that converts signal charge into voltage or current, there is such a problem that a noise signal is generated at the time of the conversion. It is known that the noise generated at the time of signal conversion is 1/f noise generated by the number of carriers being modulated such that a level of an interface of the gate portion of MOS transistor with Si—$SiO_2$, for example, captures and releases carriers relating to conduction at random.

The 1/f noise amount v is expressed with the following formula (1) or (2);

$$v^2 = a_f/(C_{OX}^2 \cdot L \cdot W \cdot f) \tag{1}$$

or $$v^2 = a_f/(C_{OX} \cdot L \cdot W \cdot f) \tag{2}$$

where $C_{ox}$ is a gate insulating film capacity,
L is a gate length,
W is a gate width,
f is an operation frequency,
$a_f$ is $5 \times 10^{-31}$ [$C^2/cm^2$] in case of n-channel MOS, and $5 \times 10^{-32}$ [$C^2/cm^2$] in case of p-channel MOS.

As is clear in the above formula, the 1/f noise amount v is dependent on the capacity of the gate insulating film, that is, on the thickness of the film.

However, typically, the thickness of the gate insulating film of the amplifier MOS transistor is selected to be the same as that of the other transistors, and so there has been a difficulty in reducing the 1/f noise.

[Patent Reference 1] Japanese Published Patent Application No. 2000-299453
[Patent Reference 2] Japanese Published Patent Application No. 2003-143480

SUMMARY OF THE INVENTION

The present invention provides a solid-state imaging device in which the above-described various problems in the solid-state imaging device are solved, specifically, withstand voltage is improved and 1/f noise is reduced, and a method of manufacturing the solid-state imaging device.

A solid-state imaging device according to an embodiment of the present invention is a MOS type solid-state imaging device including a unit pixel that has at least a photoelectric converting portion and a plurality of insulated-gate field effect transistors, in which the thickness of gate insulating film in a part of the insulated-gate field effect transistors is different from the thickness of gate insulating film in at least a part of the other insulated-gate field effect transistors among the plurality of the insulated-gate field effect transistors.

According to the embodiment of the present invention, the thickness of gate insulating film in a signal charge readout insulated-gate field effect transistor adjacent to the photoelectric converting portion of the unit pixel is selected to be larger than the thickness of gate insulating film in the other field effect transistors of the unit pixel.

According to the embodiment of the present invention, the thickness of gate insulating film in an amplifier insulated-gate field effect transistor that converts the signal charge of the unit pixel into a voltage or current signal is selected to be smaller than the thickness of gate insulating film in the other insulated-gate field effect transistors of the unit pixel.

A method of manufacturing the solid-state imaging device according to an embodiment of the present invention is a method of manufacturing a solid-state imaging device including a unit pixel that has at least a photoelectric converting portion and a plurality of insulated-gate field effect transistors, in which the thickness of gate insulating film in a part of insulated-gate field effect transistors is different from the thickness of gate insulating film in at least a part of the other insulated-gate field effect transistors among the plurality of insulated-gate field effect transistors, and the method includes the steps of: in the process of forming the gate insulating film, forming on the surface of a semiconductor substrate a first mask layer to form gate insulating film in which at least a first opening ultimately to form a gate insulating film of a first thickness and an opening of a second thickness to form a gate insulating film of a second thickness smaller than the first thickness are formed; forming a first insulating layer having a thickness smaller than the first thickness in the first and second openings; forming a second mask layer that covers the first insulating layer in the first opening and that has an opening to expose the first insulating layer in the second opening; removing the first insulating layer through the opening of the second mask layer; and removing the second mask layer and forming a gate insulating film of the second thickness through the first and second openings of the first mask layer, wherein the gate insulating film of the first thickness is formed of a overlapped portion of the first and second insulating layers, and the gate insulating film of the second thickness is formed of the second insulating layer.

DESCRIPTION OF THE PREFERRED EMBODIMENTS

An embodiment of a MOS transistor according to the present invention is explained. However, a MOS type solid-state imaging device according to an embodiment of the present invention is not limited thereto.

Figure 1:
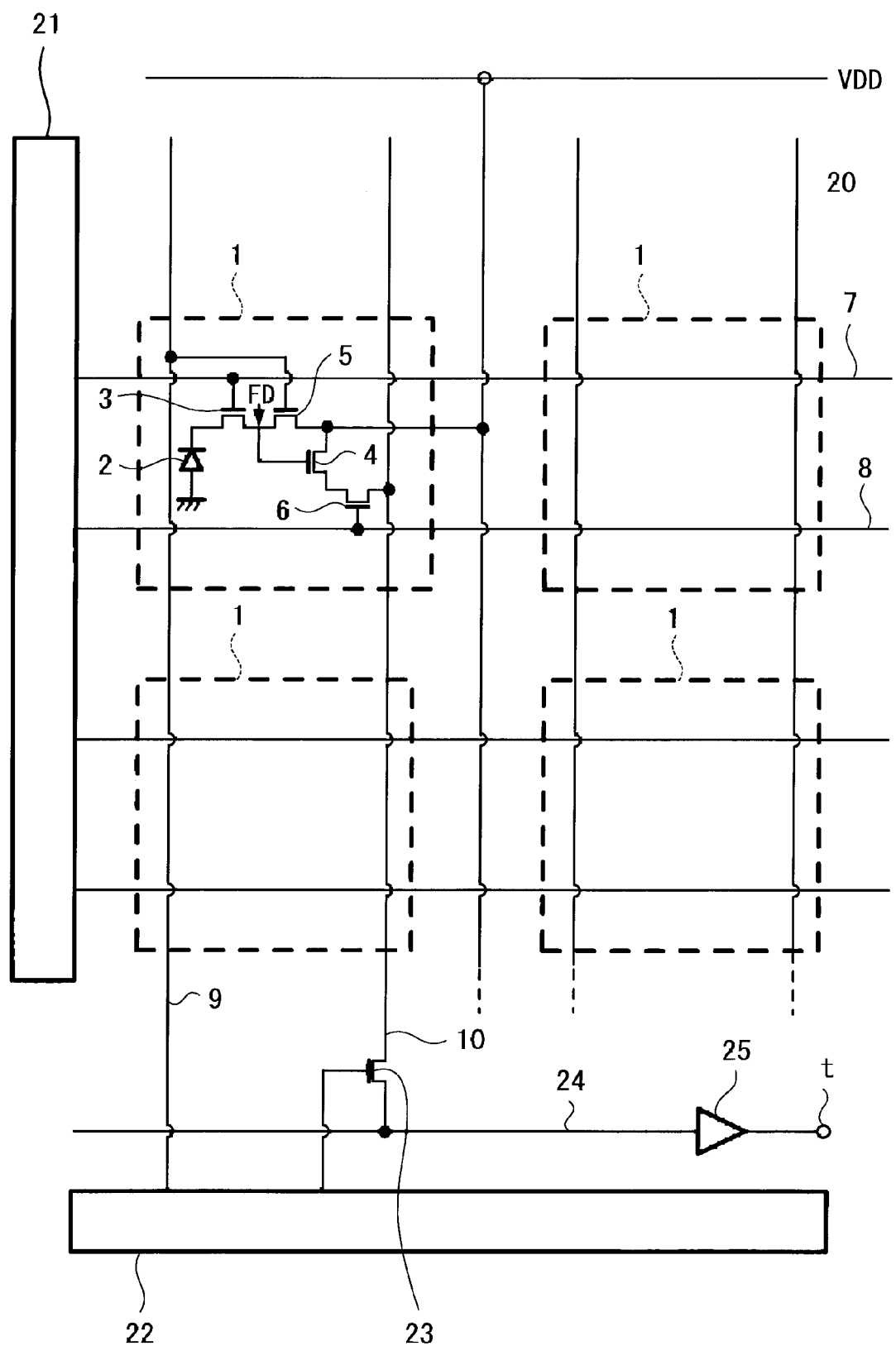
FIG. 1 is a schematic constitutional diagram of a solid-state imaging device according to an embodiment of the present invention.

FIG. 1 is a schematic constitutional diagram showing a solid-state imaging device that is an embodiment of a MOS type solid-state imaging device according to the present invention, which includes an imaging portion 20, in which a plurality of unit pixels 1 are arrayed respectively in the horizontal and vertical directions in a matrix form, and peripheral circuits such as a vertical driver circuit 21 and a horizontal driver circuit 22.

Figure 2:
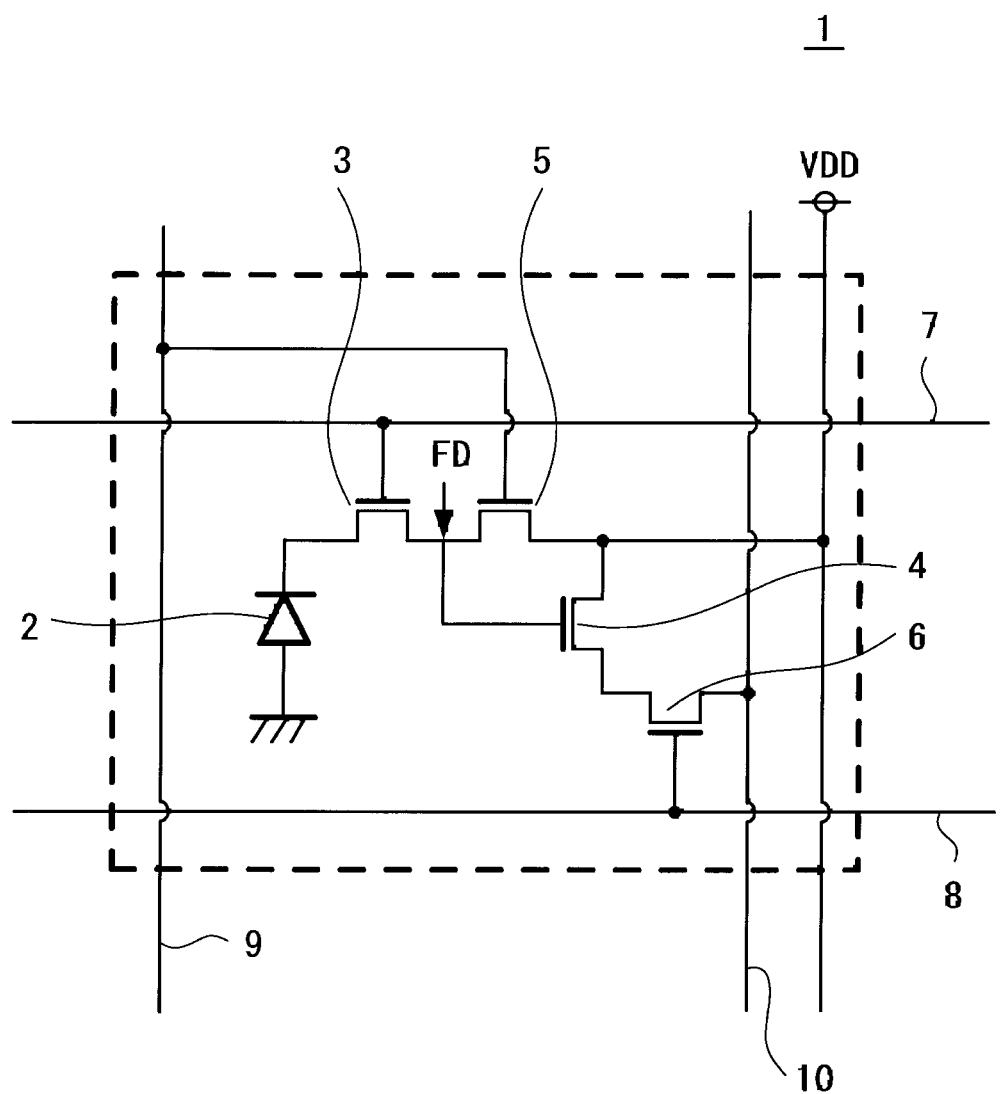
FIG. 2 is a schematic constitutional diagram showing a unit pixel of a solid-state imaging device according to an embodiment of the present invention.

As explained referring to FIG. 2, the unit pixel 1 includes a photodiode 2 that is a photoelectric converting portion functioning as a sensor, a readout MOS transistor 3 that reads out signal charge generated in accordance with the amount of light received by the photodiode 2, an FD (Floating Diffusion) amplifier MOS transistor 4 that converts the signal charge into voltage or current corresponding to the amount thereof, an FD reset MOS transistor 5, and a vertical selection MOS transistor 6 as a vertical selection switch element.

Further, in each row (horizontal line), gate electrodes of the readout MOS transistors 3 are connected to a common vertical readout line 7, and gate electrodes of the vertical selection MOS transistors 6 are connected to a common vertical selection line 8.

Further, gate electrodes of the reset MOS transistors 5 in each column (vertical line) are connected to a common horizontal reset line 9, and drains of the vertical selection MOS transistors 6 are connected to a common vertical signal line 10.

Each vertical signal line 10 is connected to a horizontal signal line 24 through a MOS transistor of a horizontal switch element 23 shown in FIG. 1, and is connected to an output terminal t through an amplifier 25.

Each of the vertical selection lines 8 and vertical readout lines 7 is connected to the vertical driver circuit 21, and a vertical scanning pulse and a horizontal readout pulse are applied, respectively.

The horizontal reset line 9 and a control electrode that is a gate electrode of the vertical switch element 23 are connected to the horizontal driver circuit 22, and a horizontal reset pulse and a horizontal scanning pulse are applied sequentially.

Thus, in the state where the vertical scanning pulse is applied from the vertical driver circuit 21 to the vertical selection line 8, in the unit pixel 1 at a position where a required pulse voltage is applied to the vertical readout line and the horizontal scanning pulse is applied to the switch element 23 of the vertical signal line 10 to be the ON state, output of the amplifier MOS transistor 4 is selected and extracted from the vertical selection MOS transistor to be led into the horizontal signal line through the horizontal switch element 23 and is taken out from the output terminal t as an imaging signal amplified in the amplifier 25.

Hereupon, in the embodiments of the present invention, the gate insulating films are altered in the plurality of MOS transistors constituting the unit pixel 1.

Figure 3:
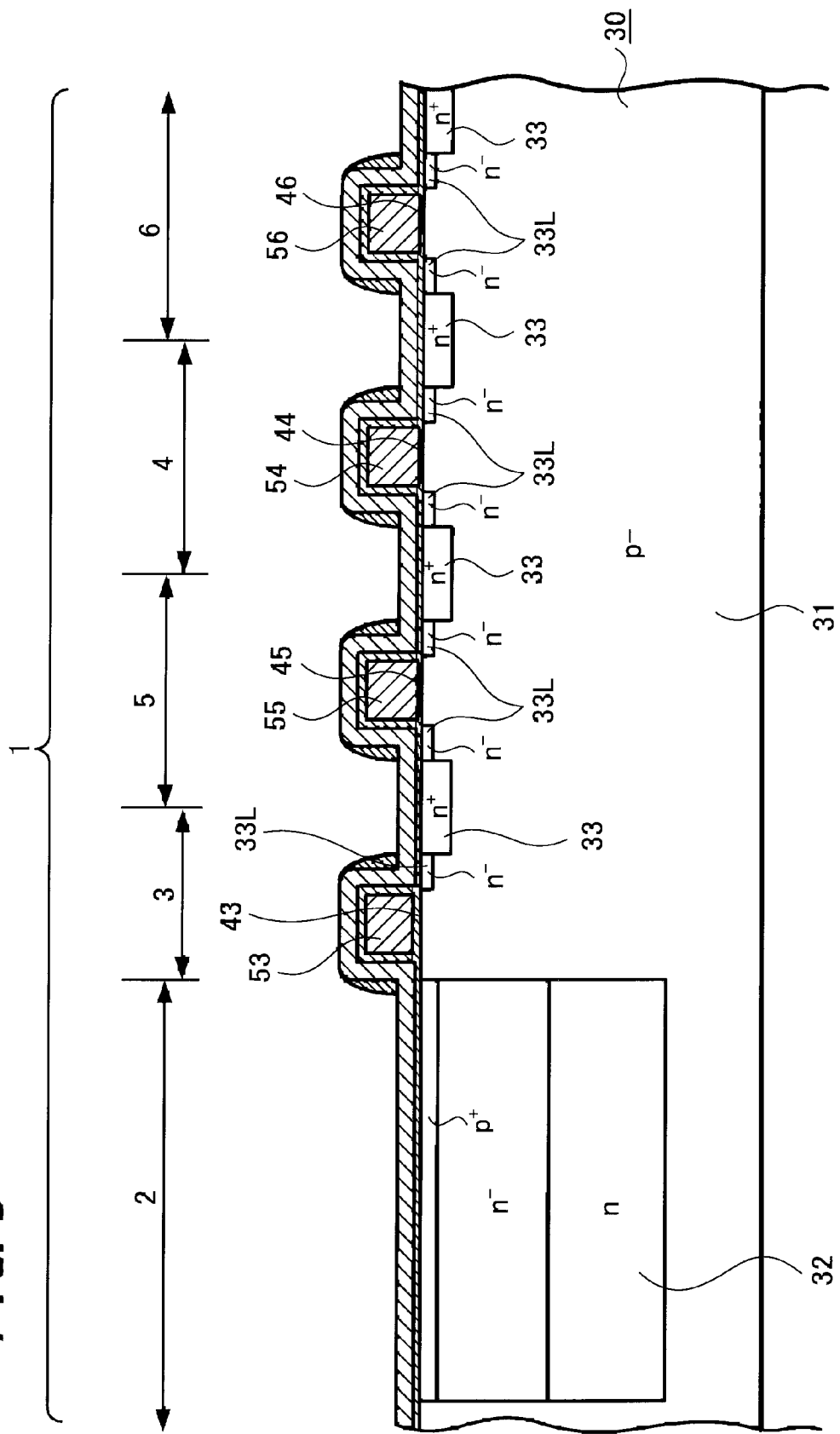
FIG. 3 is a schematic cross-sectional diagram showing a relevant part of a solid-state imaging device according to an embodiment of the present invention.
Figure 4:
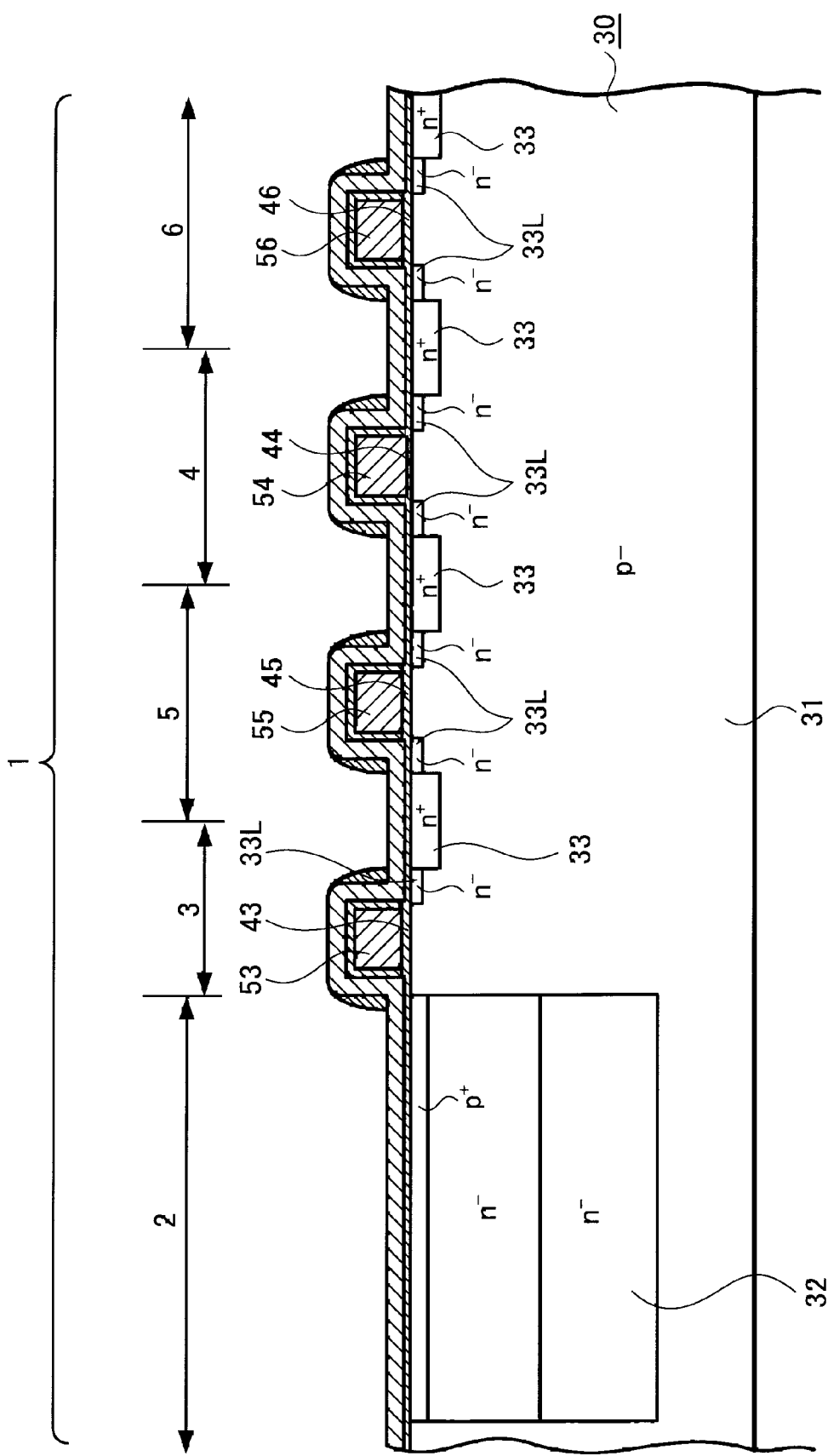
FIG. 4 is a schematic cross-sectional diagram showing a relevant part of a solid-state imaging device according to an embodiment of the present invention.

Referring to FIGS. 3 and 4, an embodiment 1 (FIG. 3) and an embodiment 2 (FIG. 4) according to the present invention are explained.

FIGS. 3 and 4 are schematic cross-sectional diagrams of one unit pixel in a solid-state imaging device, each showing across the photoelectric converting portion (photodiode), readout MOS transistor 3, reset MOS transistor 5, amplifier MOS transistor 4, vertical selection MOS transistor 6.

Both FIGS. 3 and 4 show the case where each of MOS transistors is an n-channel MOS transistor.

In this case, in a semiconductor substrate 30 are formed a p-type well region 31, and an n-type well region 32 to form the photodiode 2 of the photoelectric converting portion in which an n-type region is formed with a high concentration p-type charge accumulation layer being formed on the surface thereof.

Then, the readout MOS transistor 3 is formed adjacently to the photoelectric converting portion 2, and further with an adjacent drain region or source region being a common n-type drain or source region, the reset MOS transistor 5, amplifier MOS transistor 4, and vertical selection MOS transistor 6 are formed between the regions with gate electrodes 53, 55, 54, 56 respectively formed thereon through gate insulating films 43, 45, 44, 46 respectively, and accordingly the readout MOS transistor 3, reset MOS transistor 5, amplifier MOS transistor 4, and vertical selection MOS transistor 6 are obtained respectively.

Each of those MOS transistors has what is called an LDD (Lightly Doped Drain) transistor structure in which a low concentration drain or source region 33L is formed on the side adjacent to the gate side of each drain or source region 33.

Embodiment 1

As shown in FIG. 3, in this example, the thickness of gate insulating film 43 in the readout MOS transistor 3 is made 9 nm, for example, which is larger than the film thickness of, for example, 6 nm of each of gate insulating films 44, 45, 46 in the other MOS transistors 4, 5, 6.

According to this embodiment, the withstand voltage between the gate and drain of the readout MOS transistor 3 can be improved and so the dynamic range can be made large as described at first.

Embodiment 2

As shown in FIG. 4, in this example, the thickness of gate insulating film 44 in the amplifier MOS transistor 4 is made 6 nm, for example, which is smaller than the film thickness of, for example, 9 nm of each of gate insulating films 43, 45, 46 in the other MOS transistors 3, 5, 6.

According to this embodiment, $C_{OX}$ of the amplifier MOS transistor 4 can be made large to reduce 1/f noise.

Therefore, in the embodiment 1 for example, dynamic range can be made large with the gate insulating film of readout MOS transistor 3 being formed large in thickness and with the gate insulating films of the other MOS transistors including the amplifier MOS transistor being formed small in thickness.

Next, an embodiment of a method of manufacturing the above-described solid-state imaging device according to the present invention is explained. In this case, methods typically used to form semiconductor regions can be employed to form the respective regions, specifically, to form the above-described each of the well regions and photoelectric converting portion (photodiode), the drain or source region and the gate electrode in each of MOS transistors, and the like; however, since a specific method is employed in the process of forming the gate insulating film whose thickness is different, an embodiment thereof is explained referring to FIG. 5.

In this case, a region (referred to as a first region 61) to form a MOS transistor that has a requiring gate insulating film of large thickness, which is the readout MOS transistor 3 in the embodiment 1, for example, and a region (referred to as a second region 62) to form the other MOS transistors 4, 5, 6 are shown representatively.

Figure 5A:
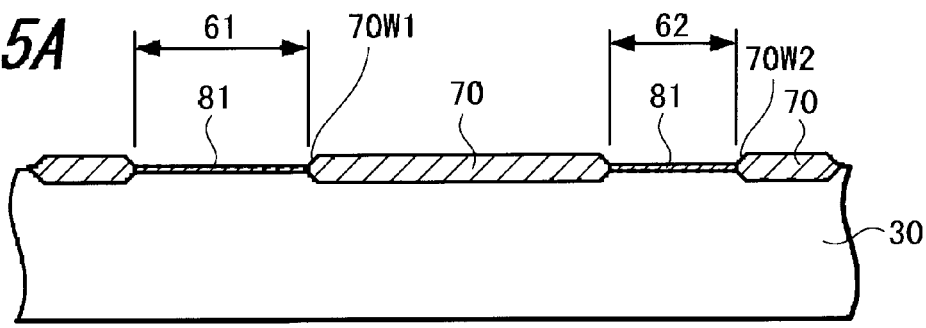
FIGS. 5A through 5E are manufacturing process diagrams showing part of a method of manufacturing a solid-state imaging device according to an embodiment of the present invention.

As shown in FIG. 5A, a mask layer 70 having first and second openings 70W1 and 70W2 is formed on the first and second regions 61 and 62 of the semiconductor substrate 30 made of Si, for example. This mask layer can be made of an isolating and insulating layer formed by localized thermal oxidation, that is, by LOCOS, for example.

A first insulating layer 81 having a thickness T1 that is smaller than the thickness of the gate insulating film 43 having a large film thickness ultimately formed in the first and second regions 61 and 62 is formed by surface thermal oxidation of the semiconductor substrate 30, for example.

Figure 5B:
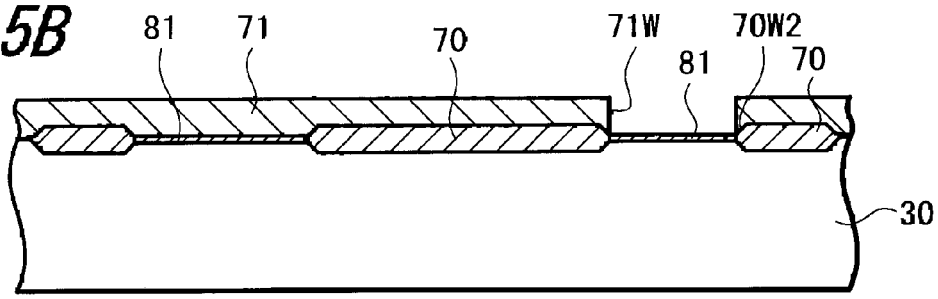

As shown in FIG. 5B, a second mask layer 71 made of a photo-resist layer in which an opening 71W is formed in the second region 62 by photolithography, for example, is formed on the semiconductor substrate 30. This opening 71W can be formed larger than the above-described second opening 70W2 and can also be formed by positioning with a large margin to an extent not reaching the opening 70W1.

Figure 5C:
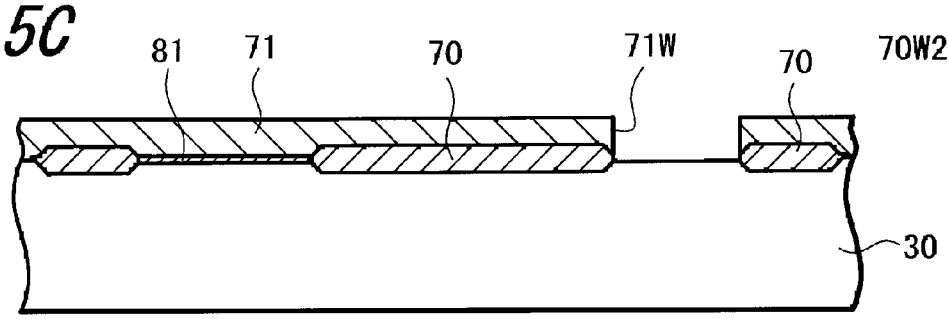

As shown in FIG. 5C, with the second mask layer 71 being used as an etching mask, the first insulating layer 81 of the second region 62 is etched and removed through the opening 71W.

Figure 5D:
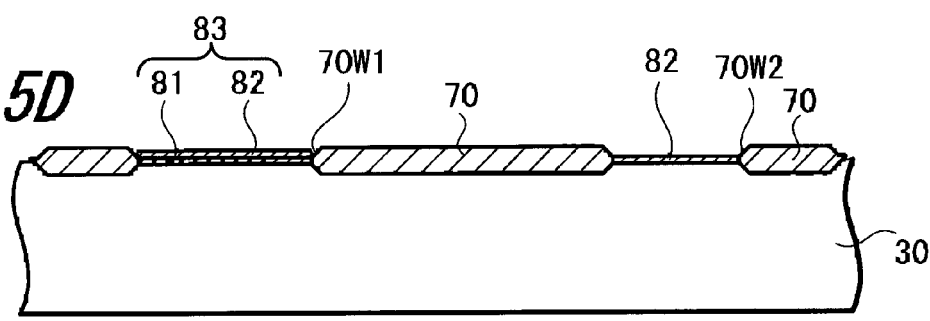

As shown in FIG. 5D, after removing the second mask layer 71, a second insulating layer 82 having a thickness T2 is further formed by second thermal oxidation, for example, in the first and second regions 61 and 62.

Thus, the intended thick gate insulating film 43 made of a third insulating layer 83 having a large thickness T3 can be formed in the first region 61 by forming the first and second insulating layers, that is, with first and second thermal oxidation conditions such as adjusting time, for example.

Figure 5E:
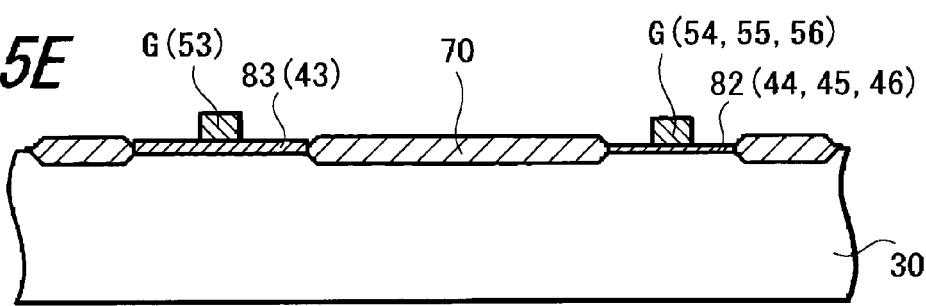

Therefore, as shown in FIG. 5E, the gate insulating film 43 of the readout MOS transistor 3 having a large thickness can be formed in the first region 61, for example, and each of gate insulating films 44, 45, 46 of the amplifier MOS transistor 4, reset MOS transistor 5 and vertical selection MOS transistor 6 having a small thickness is formed in the second region 62.

Accordingly, with the gate electrode G being formed thereon, although not shown in the figure, the low concentration drain or source region 33L being formed, and what is called a sidewall being formed on the side surface of the gate electrode G, the drain or source region 33 is formed to obtain the solid-state imaging device having the unit pixel shown in FIG. 3.

Further, when including the structure of the above-described embodiment 2, the first region 61 in FIGS. 5A to 5B is made a portion where each of gate insulating films of 43, 45, 46 of the readout MOS transistor 3, reset MOS transistor 5 and vertical selection MOS transistor 6 is formed, and the second region 62 is made a portion where the gate insulating film 44 of the amplifier MOS transistor is formed.

Thus, according to the embodiment of the manufacturing method of the present invention, MOS transistors including gate insulating films having a different thickness can be formed with a process simplified.

Here, although the above-described embodiments are mainly based on the n-channel MOS transistor structure, a p-channel MOS transistor structure can also be used, and in this case, the conductivity type is reversed in each drawing.

Figure 6:
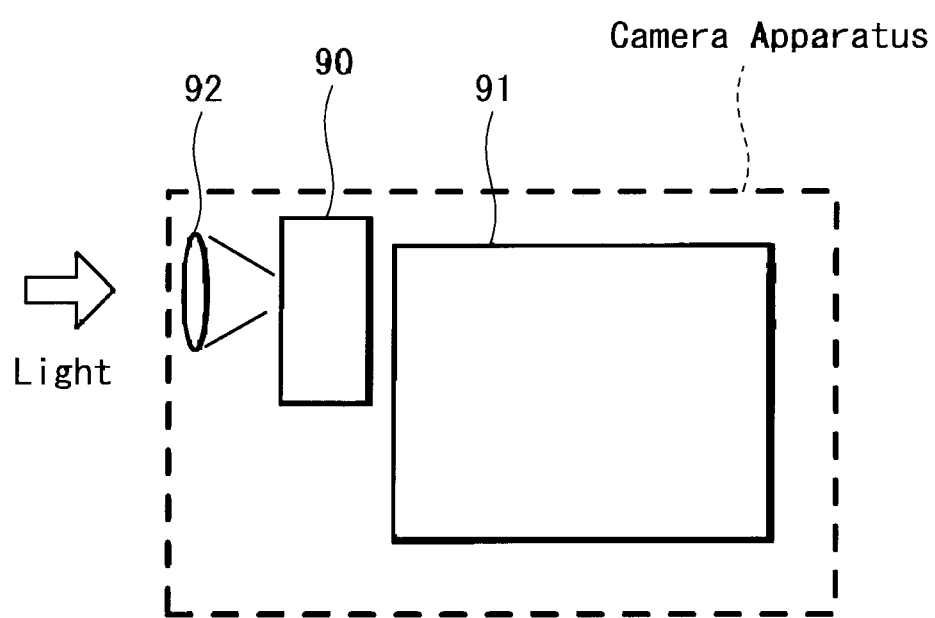
FIG. 6 is a constitutional diagram of a camera apparatus according to an embodiment of the present invention.

Further, the solid-state imaging device according to an embodiment of the present invention may be a camera apparatus (camera, or camera module) which is formed including an optical system and other chips. In this case, the camera apparatus includes a sensing portion 90 for image pickup, a signal processing portion 91 to perform signal processing, and furthermore may include an optical system 92 as shown in FIG. 6.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device, comprising:
   a photodiode;

a transfer transistor located at a first region adjacent to the photodiode;
a plurality of transistors located at a second region, wherein the photodiode includes a p-type region and an n-type region;
the plurality of transistors include at least a reset transistor, and an amplification transistor; and
wherein a thickness of a gate insulating film of the transfer transistor is larger than a thickness of a gate insulating film of at least one transistor of the plurality of transistors.

2. The imaging device according to claim 1, wherein the thickness of the gate insulating film of the transfer transistor is larger than a thickness of a gate insulating film of the amplification transistor.

3. The imaging device according to claim 2, wherein the thickness of the gate insulating film of the transfer transistor and a thickness of a gate insulating film of the reset transistor are substantially equal.

4. The imaging device according to claim 1, wherein the photodiode is associated with the transfer transistor and the transfer transistor is configured to transfer an electric charge from the photodiode to a floating diffusion.

5. The imaging device according to claim 4, wherein the floating diffusion is associated with the reset transistor and the amplification transistor.

6. The imaging device according to claim 5, wherein the amplification transistor is associated with a vertical signal line.

7. The imaging device according to claim 6, wherein the vertical signal line is associated with an amplification circuit through a switching circuit.

8. The imaging device according to claim 1, wherein a gate of the transfer transistor is connected to a transfer line arranged in a horizontal direction.

9. The imaging device according to claim 1, wherein a gate of the reset transistor is connected to a reset line arranged in a vertical direction.

10. The imaging device according to claim 1, wherein a gate of a selection transistor is connected to a selection line arranged in a horizontal direction.

11. The imaging device according to claim 1, wherein the transfer transistor is an n-channel MOS transistor.

12. The imaging device according to claim 1, wherein the transfer transistor is a p-channel MOS transistor.

13. The imaging device according to claim 8, wherein the gate of the transfer transistor contacts a side wall insulating layer.

14. The imaging device according to claim 1, wherein the plurality of transistors include a selection transistor.

* * * * *